(12) United States Patent
Chen et al.

(10) Patent No.: US 11,621,205 B2
(45) Date of Patent: Apr. 4, 2023

(54) UNDERFILL STRUCTURE FOR SEMICONDUCTOR PACKAGES AND METHODS OF FORMING THE SAME

(71) Applicant: Taiwan Semiconductor Manufacturing Co., Ltd., Hsinchu (TW)

(72) Inventors: Yu-Wei Chen, Hsinchu (TW); Li-Chung Kuo, Taipei (TW); Ying-Ching Shih, Hsinchu (TW); Szu-Wei Lu, Hsinchu (TW); Jing-Cheng Lin, Hsinchu (TW); Long Hua Lee, Taipei (TW); Kuan-Yu Huang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 10 days.

(21) Appl. No.: 17/208,694

(22) Filed: Mar. 22, 2021

(65) Prior Publication Data
US 2021/0210400 A1 Jul. 8, 2021

Related U.S. Application Data

(63) Continuation of application No. 16/177,637, filed on Nov. 1, 2018, now Pat. No. 11,075,133.
(Continued)

(51) Int. Cl.
*H01L 23/31* (2006.01)
*H01L 23/498* (2006.01)
(Continued)

(52) U.S. Cl.
CPC ........ *H01L 23/3135* (2013.01); *H01L 21/563* (2013.01); *H01L 23/3128* (2013.01);
(Continued)

(58) Field of Classification Search
CPC ............... H01L 23/3135; H01L 21/568; H01L 23/3128
See application file for complete search history.

(56) References Cited

U.S. PATENT DOCUMENTS 7,141,448 B2 11/2006 Ramalingam et al.
8,993,380 B2 3/2015 Hou et al.
(Continued)

FOREIGN PATENT DOCUMENTS

CN 1350702 A 5/2002
CN 102623441 A 8/2012
(Continued)

*Primary Examiner* — Errol V Fernandes
(74) *Attorney, Agent, or Firm* — Slater Matsil, LLP

(57) ABSTRACT

A method for forming an underfill structure and semiconductor packages including the underfill structure are disclosed. In an embodiment, the semiconductor package may include a package including an integrated circuit die; an interposer bonded to the integrated circuit die by a plurality of die connectors; and an encapsulant surrounding the integrated circuit die. The semiconductor package may further include a package substrate bonded to the interposer by a plurality of conductive connectors; a first underfill between the package and the package substrate, the first underfill having a first coefficient of thermal expansion (CTE); and a second underfill surrounding the first underfill, the second underfill having a second CTE less than the first CTE.

20 Claims, 20 Drawing Sheets

Related U.S. Application Data

(60) Provisional application No. 62/692,177, filed on Jun. 29, 2018.

(51) Int. Cl.
  *H01L 21/56* (2006.01)
  *H01L 23/00* (2006.01)
  *H01L 25/065* (2023.01)

(52) U.S. Cl.
  CPC ........ *H01L 23/49816* (2013.01); *H01L 24/16* (2013.01); *H01L 25/0657* (2013.01); *H01L 2224/16225* (2013.01); *H01L 2225/0651* (2013.01); *H01L 2225/0652* (2013.01)

(56) References Cited

U.S. PATENT DOCUMENTS

| | | | |
|---|---|---|---|
| 9,281,254 B2 | 3/2016 | Yu et al. | |
| 9,299,649 B2 | 3/2016 | Chiu et al. | |
| 9,343,432 B2 | 5/2016 | Lee et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,583,461 B2 | 2/2017 | Lin et al. | |
| 9,627,329 B1 | 4/2017 | Kwon et al. | |
| 9,666,502 B2 | 5/2017 | Chen et al. | |
| 9,698,072 B2 | 7/2017 | Brofman et al. | |
| 9,721,930 B2 | 8/2017 | Lee et al. | |
| 9,735,131 B2 | 8/2017 | Su et al. | |
| 9,935,080 B2 | 4/2018 | Hung et al. | |
| 2004/0150118 A1* | 8/2004 | Honda | H01L 24/28 |
| | | | 257/E21.503 |
| 2005/0082670 A1 | 4/2005 | Quinones et al. | |
| 2007/0238220 A1 | 10/2007 | Lii et al. | |
| 2010/0148362 A1 | 6/2010 | Sakuarai | |
| 2012/0119346 A1 | 5/2012 | Im et al. | |
| 2012/0119353 A1 | 5/2012 | Gaynes et al. | |
| 2012/0211885 A1 | 8/2012 | Choi et al. | |
| 2014/0091460 A1 | 4/2014 | Lee et al. | |
| 2014/0284040 A1* | 9/2014 | Colgan | H01L 23/373 |
| | | | 165/185 |
| 2014/0327150 A1 | 11/2014 | Jung et al. | |
| 2015/0130083 A1 | 5/2015 | Park et al. | |
| 2015/0228614 A1 | 8/2015 | Interrante et al. | |
| 2015/0235936 A1* | 8/2015 | Yu | H01L 23/36 |
| | | | 257/737 |
| 2015/0371916 A1 | 12/2015 | Barr et al. | |
| 2016/0027764 A1 | 1/2016 | Kim et al. | |
| 2016/0049345 A1 | 2/2016 | Brofman et al. | |
| 2017/0084550 A1 | 3/2017 | Tsai et al. | |
| 2017/0194289 A1 | 7/2017 | Chen et al. | |
| 2017/0323868 A1 | 11/2017 | Park et al. | |

FOREIGN PATENT DOCUMENTS

| | | |
|---|---|---|
| CN | 103325703 A | 9/2013 |
| CN | 107403733 A | 11/2017 |
| CN | 106328605 B | 1/2019 |

* cited by examiner

UNDERFILL STRUCTURE FOR SEMICONDUCTOR PACKAGES AND METHODS OF FORMING THE SAME

CROSS-REFERENCE TO RELATED APPLICATIONS

This application is a continuation of U.S. application Ser. No. 16/177,637, filed on Nov. 11, 2018 and entitled "Underfill Structure for Semiconductor Packages and Methods of Forming the Same," which claims the benefit of U.S. Provisional Application No. 62/692,177, filed on Jun. 29, 2018, and entitled "Underfill Structure for Semiconductor Packages and Methods of Forming the Same," which patent application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
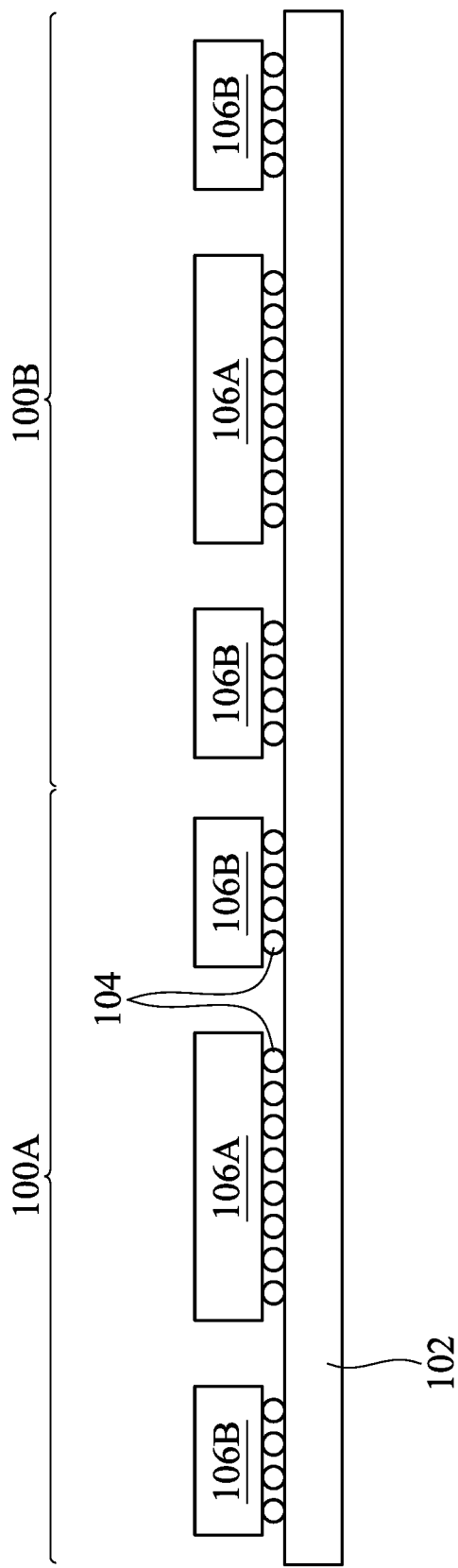
FIGS. 1 through 9B illustrate cross-sectional views of intermediary stages of manufacturing a semiconductor device package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein relate to underfill structures and methods of forming underfill structures for use in various semiconductor packages. In some embodiments, the underfill structures may be applied to a device package comprising one or more semiconductor chips bonded to an interposer and a package substrate bonded to a side of the interposer opposing the one or more semiconductor chips. The device package may be referred to a chip-on-wafer-on-substrate (CoWoS) ultra-thin sandwich (UTS) package. In other embodiments, the underfill structures may be applied to a package structure (e.g., a package on package (PoP) structure) including a first package component and a second package component. The second package component may be a memory package (e.g., having one or more dynamic random access memory (DRAM) dies), which is physically and electrically coupled to the first package component (e.g., an integrated fan-out (InFO) package having a logic die and redistribution structures) using functional connectors.

The underfill structures may include a first underfill and a second underfill surrounding the first underfill. The second underfill may have a lower coefficient of thermal expansion (CTE) than the first underfill. Compared to embodiments in which an underfill structure only includes a single underfill material, embodiments including the first underfill and the second underfill may have improved reliability. For example, the first underfill and the second underfill may prevent underfill cracking, underfill delamination, and bump cracking by reducing high stress at the corners of a packaged die, which may be a super-large die (e.g., a die having an area of greater than 1000 mm$^2$). Including the first underfill and the second underfill can reduce the stress at the corners of the dies such that reliability is increased.

Figure 3:
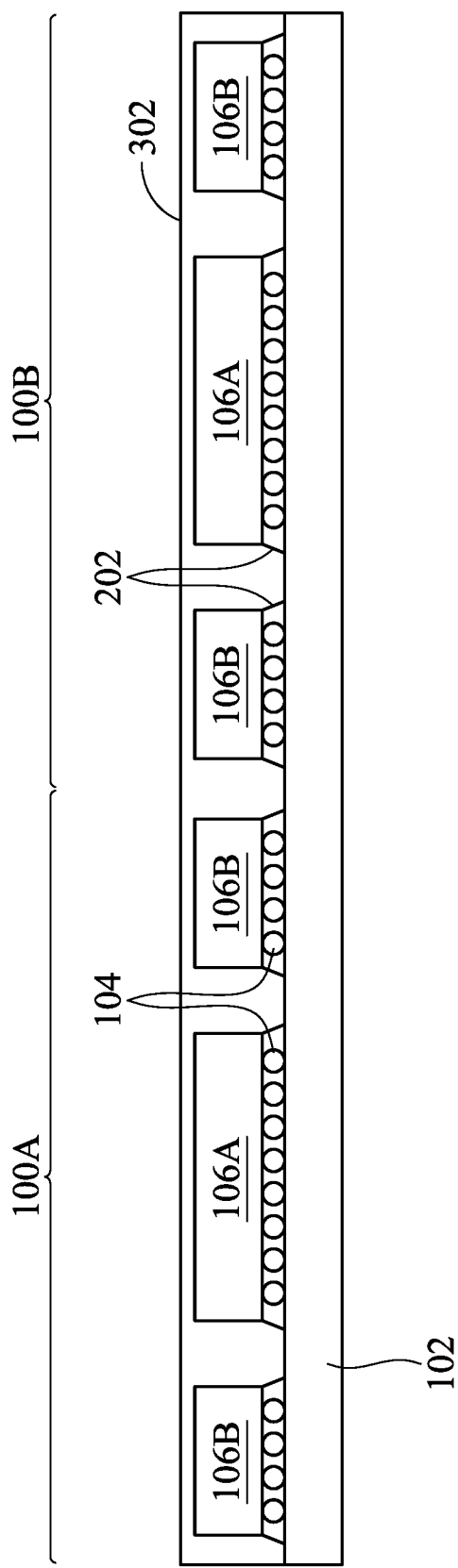
Figure 4:
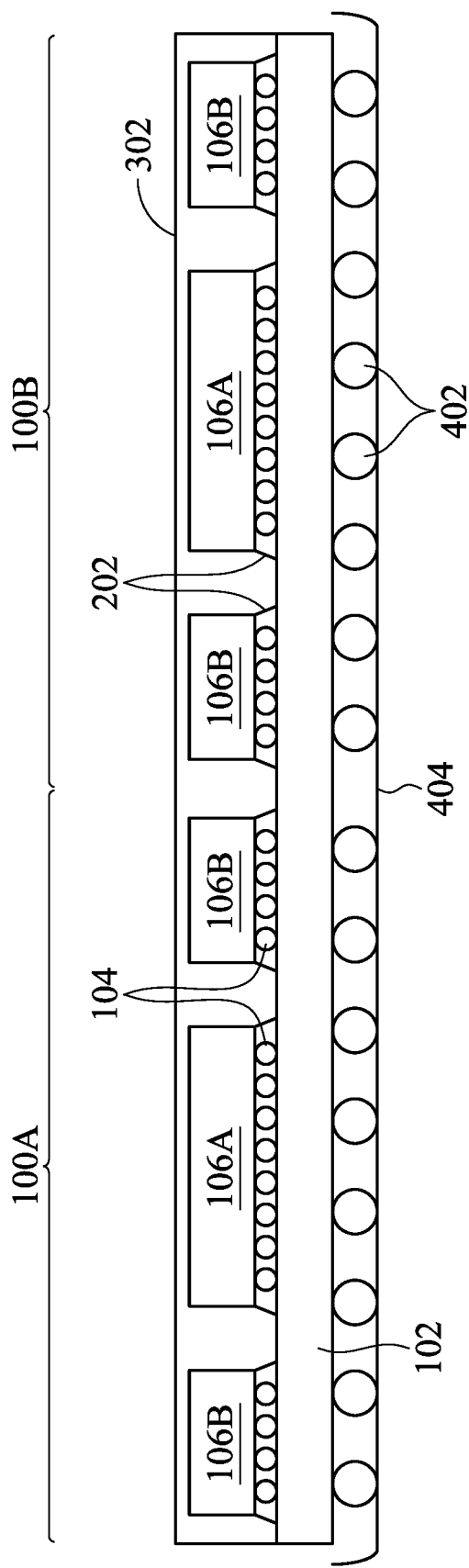
Figure 5:
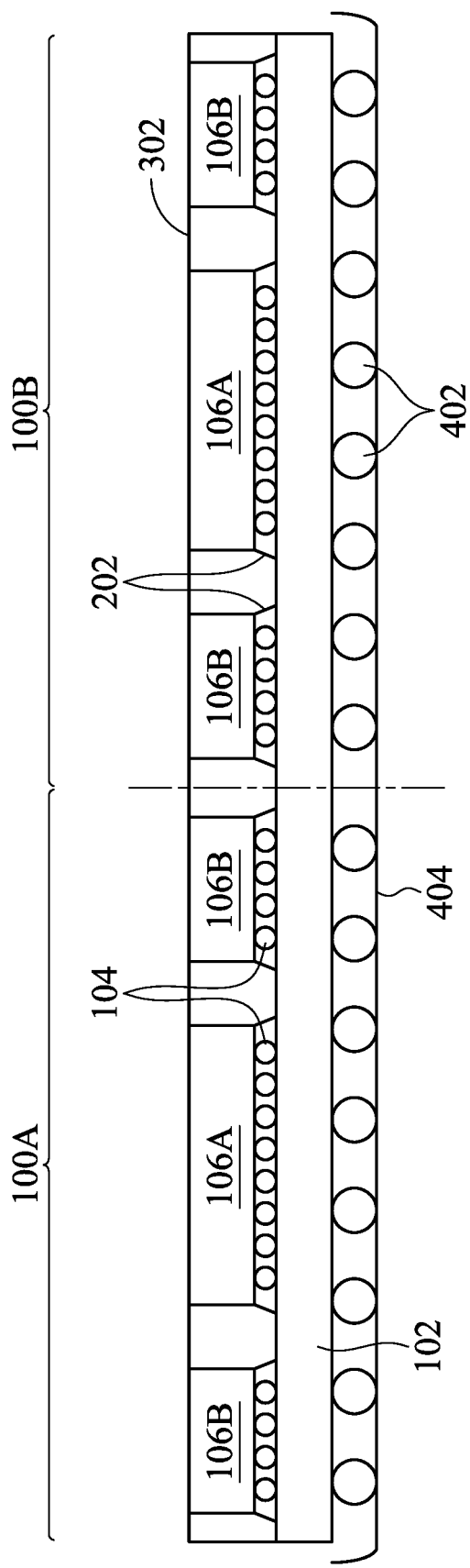
Figure 6:
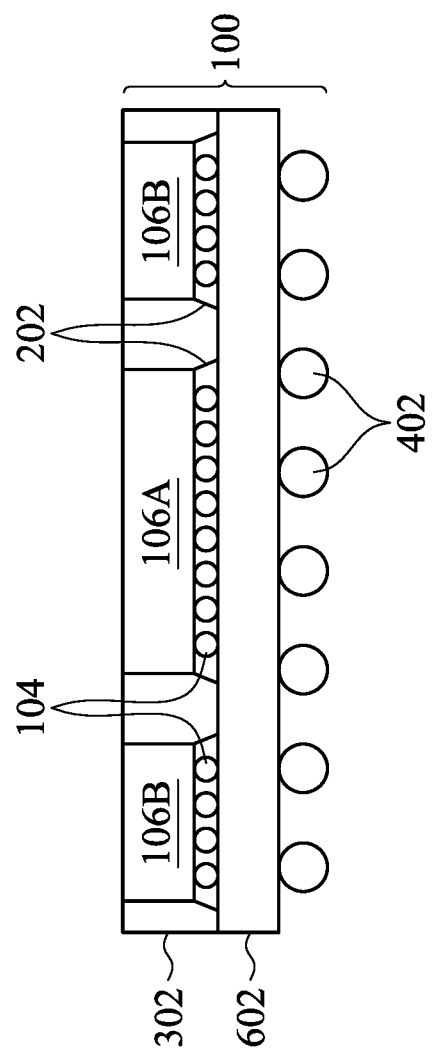
Figure 7:
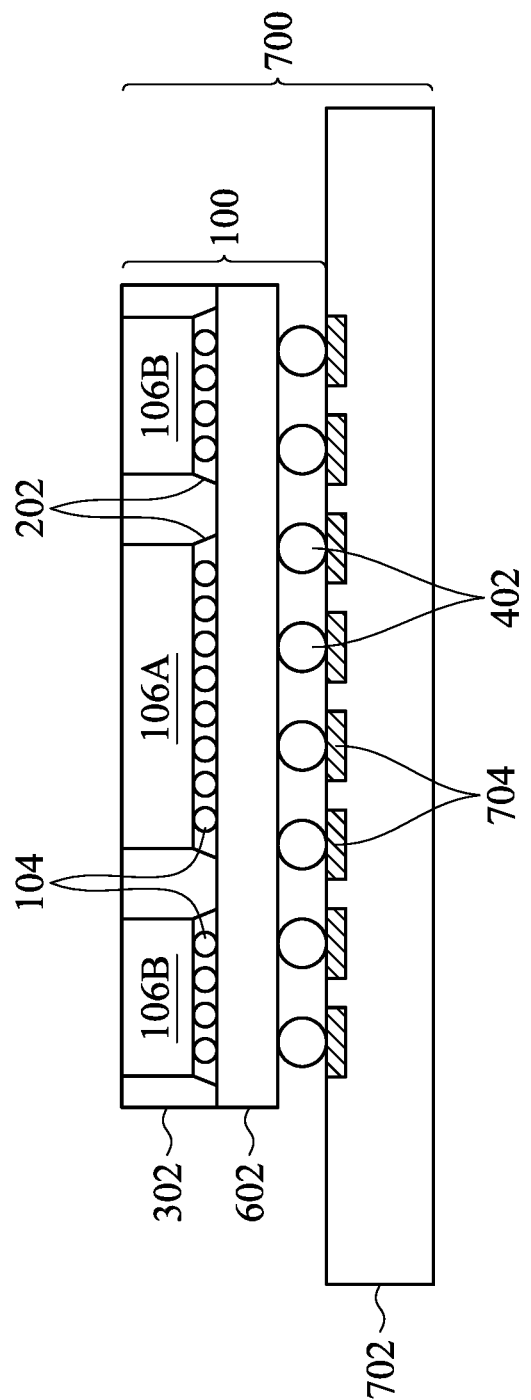
Figure 8:
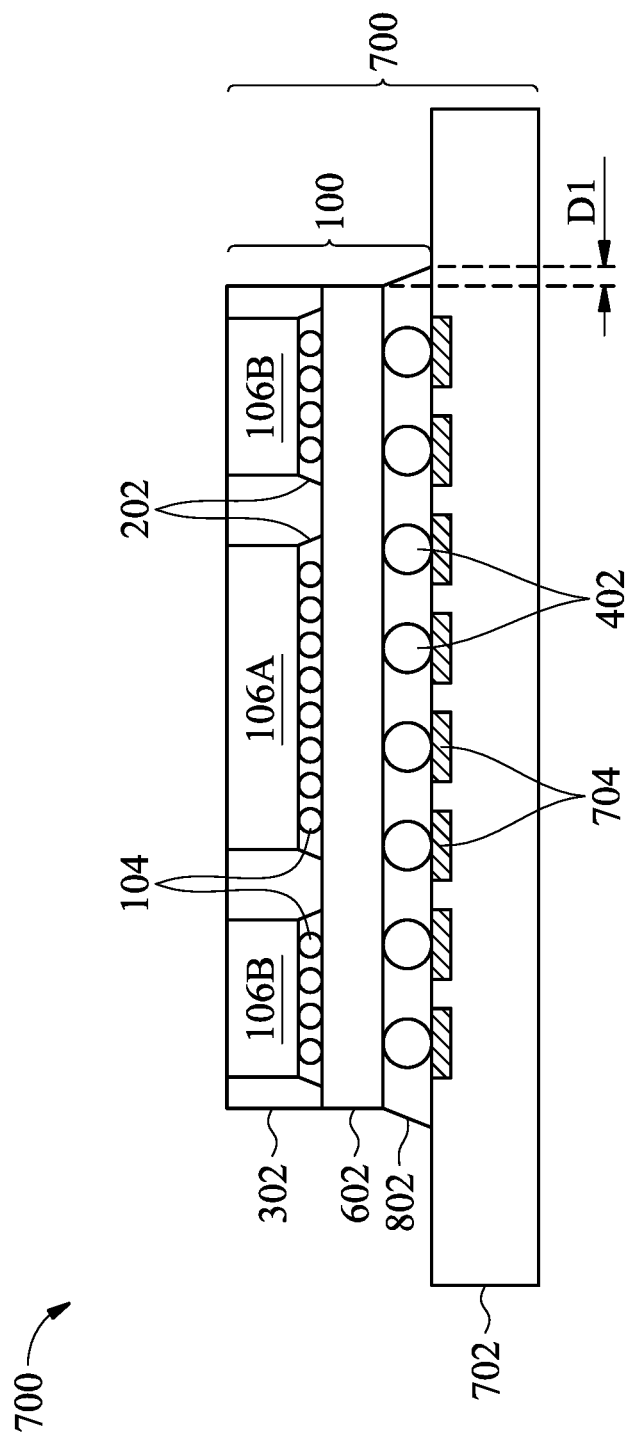
Figure 9:
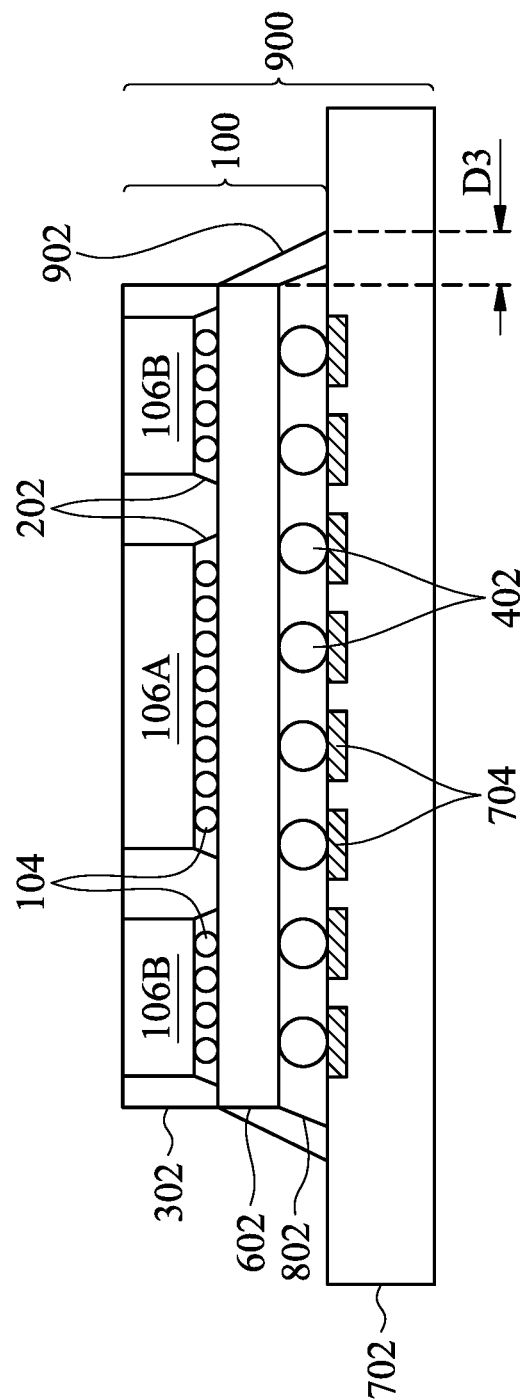
Figure 9A:
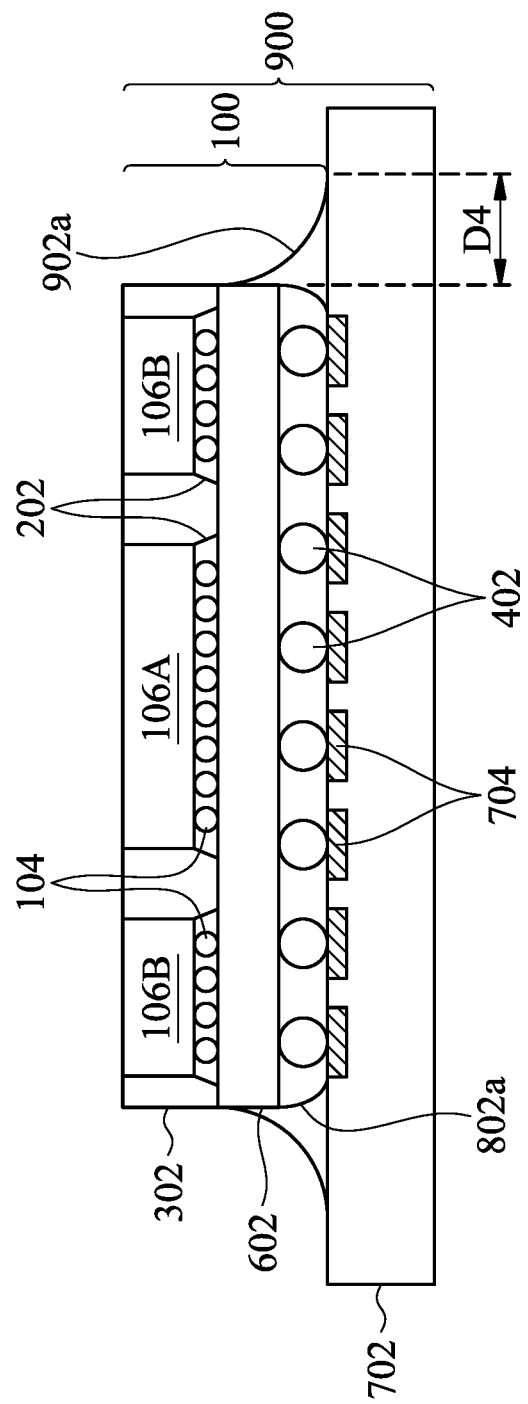
Figure 9B:
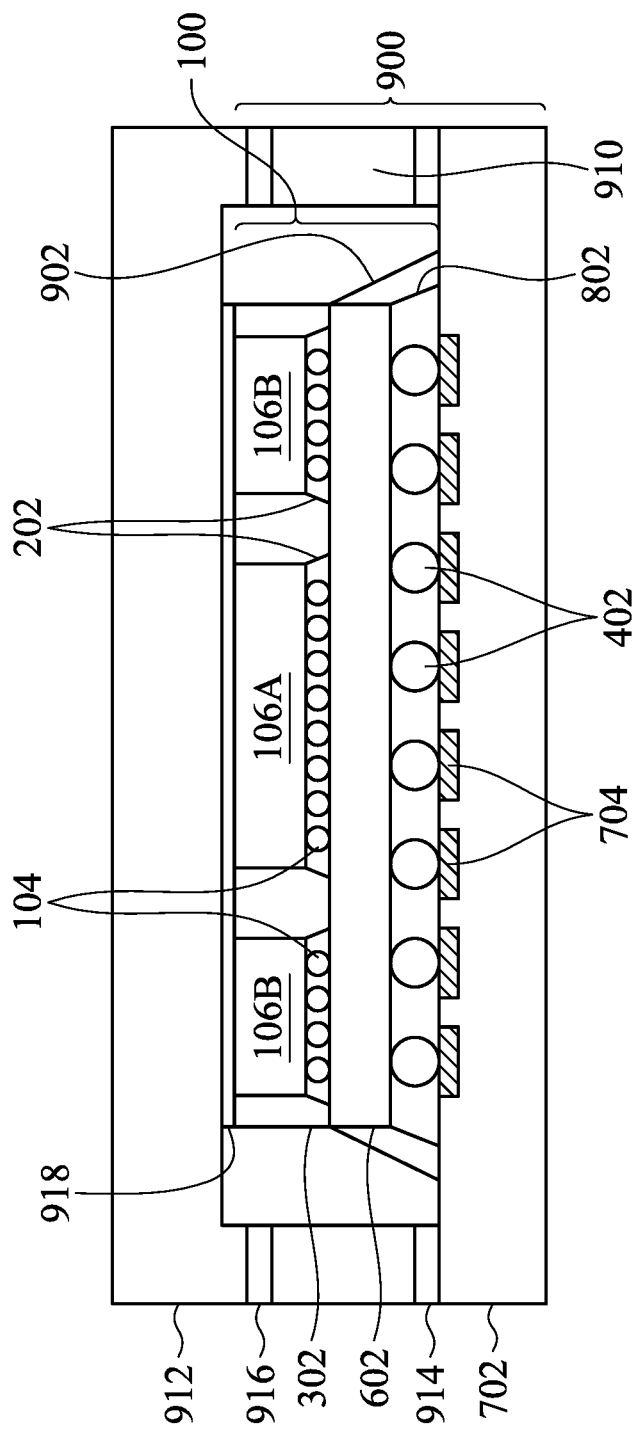

FIGS. 1 through 9B are various cross-sectional views of intermediate steps during a process for forming a semiconductor device 900, in accordance with some embodiments. In FIGS. 1 through 5, a first device package 100 is formed by bonding various integrated circuit dies to a wafer 102. In an embodiment, the first device package 100 is a chip-on-wafer (CoW) package, although it should be appreciated that embodiments may be applied to other 3DIC packages. FIG. 5 shows the resulting first device package 100. In FIGS. 6 and 7, a second device package 700 is formed by mounting the first device package 100 to a substrate. In an embodiment, the second device package 700 is a chip-on-wafer-on-substrate (CoWoS) package, although it should be appreciated that embodiments may be applied to other 3DIC packages. FIGS. 9, 9A, and 9B show the semiconductor device 900 implementing the resulting second device package 700.

The wafer 102 may have a variety of devices formed in it. In particular, interposers, integrated circuit devices, or the like may be formed in the wafer 102, which may include multiple device regions 100A and 100B (singulated in subsequent steps to form the first device packages 100).

In some embodiments, interposers are formed in the wafer 102. The interposers have interconnect structures for electrically connecting active devices (not shown) in the integrated circuit dies to form functional circuits. In such embodiments, the wafer 102 includes a semiconductor substrate having a front surface (e.g., the surface facing upwards in FIG. 1), and a back surface (e.g., the surface facing downwards in FIG. 1). An interconnect structure is formed on the back surface of the semiconductor substrate. Through-vias (not explicitly illustrated) are formed in the semiconductor substrate extending from the interconnect structure to the front surface of the semiconductor substrate. Metal lines and vias are formed in an interconnect structure on the semiconductor substrate by, e.g., a dual damascene process. The metal lines and vias may be electrically connected to the through-vias. The interposers may (or may not) be free from active devices such as transistors and diodes, and may (or may not) be free from devices such as resistors, inductors, capacitors, and the like.

Although embodiments illustrated herein are discussed in the context of the wafer 102 having interposers formed therein, it should be appreciated that other types of devices may be formed in the wafer 102. For example, integrated circuit devices such as logic devices may be formed in the wafer 102. In such embodiments, the wafer 102 includes a semiconductor substrate with active and/or passive devices formed therein. The semiconductor substrate may be silicon, doped or undoped, or an active layer of a silicon-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate, and may be interconnected by interconnect structures formed by, for example, metallization patterns in one or more dielectric layers on the semiconductor substrate to form an integrated circuit.

As illustrated in FIG. 1, die stacks 106 are attached to the wafer 102 with die connectors 104. In an embodiment, a first die stack 106A (e.g., a graphics processing unit (GPU)) and second die stacks 106B (e.g., a high bandwidth memory (HBM)) may be placed on each device region of the wafer 102. The die stacks 106 may be attached to the wafer 102 using, for example, a pick-and-place tool. The die connectors 104 may be formed from a conductive material such as solder, copper, aluminum, gold, nickel, silver, palladium, tin, the like, or a combination thereof. In some embodiments, the die connectors 104 are formed by initially forming a layer of solder through methods such as evaporation, electroplating, printing, solder transfer, ball placement, or the like. Once a layer of solder has been formed on the structure, a reflow may be performed in order to shape the die connectors 104 into desired bump shapes. The die connectors 104 form joints between corresponding connectors on the wafer 102 and the die stacks 106, and electrically connect the wafer 102 to the die stacks 106.

The die stacks 106 may each have a single function (e.g., a logic device, memory die, etc.), or may have multiple functions (e.g., a system on chip (SoC)). In a particular embodiment, the first die stack 106A is a processor and the second die stacks 106B are memory modules. More specifically, the first die stack 106A may be a processor such as a central processing unit (CPU), GPU, application-specific integrated circuit (ASIC), or the like. In some embodiments, the second die stacks 106B may be memory devices such as dynamic random access memory (DRAM) dies, static random access memory (SRAM) dies, hybrid memory cube (HMC) modules, HBM modules, or the like.

Figure 2:
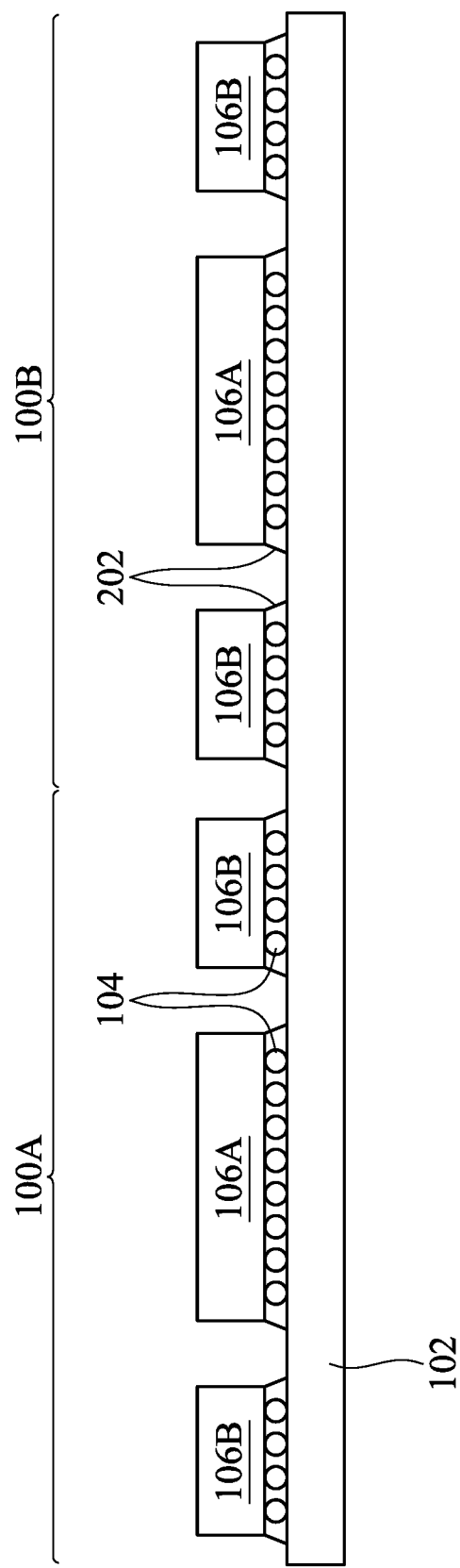

In FIG. 2, an underfill 202 may be formed between the die stacks 106 and the wafer 102, surrounding the die connectors 104. The underfill 202 may be formed by a capillary flow process after the die stacks 106 are attached, or may be formed by a suitable deposition method before the die stacks 106 are attached. The underfill 202 may be formed by the two-step process described below in reference to FIGS. 8, 9, 16, and 17, or by another suitable process.

In FIG. 3, an encapsulant 302 is formed on the various components. The encapsulant 302 may be a molding compound, epoxy, or the like, and may be applied by compression molding, transfer molding, or the like. The encapsulant 302 may be formed over the wafer 102 such that the die stacks 106 are buried or covered, as illustrated in FIG. 3. The encapsulant 302 is then cured.

In FIG. 4, conductive connectors 402 are formed on the back side of the wafer 102. The back side of the wafer 102 may be thinned before the conductive connectors 402 are formed. The thinning may be accomplished by a chemical-mechanical polish (CMP), a grinding process, or the like to achieve a desired thickness of the wafer 102 and/or to expose conductive features (e.g., through vias). The conductive connectors 402 are electrically connected to features of the wafer 102 (e.g., logic devices, interposers, etc.), and may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. In some embodiments, the conductive connectors 402 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. After the conductive connectors 402 are formed, the wafer 102 may be placed on a tape 404 for subsequent processing steps.

In FIG. 5, the encapsulant 302 is thinned to expose top surfaces of the die stacks 106. The thinning may be accomplished by a CMP, a grinding process, or the like. After the thinning, top surfaces of the encapsulant 302 and die stacks 106 are level. Following the thinning of the encapsulant 302, the wafer 102 and encapsulant 302 are singulated by a singulation process, thereby forming the first device packages 100, as illustrated in FIG. 6

FIG. 6 shows a resulting first device package 100 after singulation. As a result of the singulation process, the wafer 102 is singulated into interposers 602, with each of the first device packages 100 having an interposer 602. The singulation may be performed while the wafer 102 is on the tape 404. The singulation is performed along scribe lines between adjacent device regions. For example, as illustrated in FIG. 5, the first device packages 100 may be singulated along the dotted line between the device regions 100A and 100B. In some embodiments, the singulation process includes a sawing process, a laser process, or a combination thereof.

As a result of the singulation process, edges of the interposers 602 and encapsulant 302 are coterminous. In other words, the outer sidewalls of the interposers 602 have the same width as the outer sidewalls of the encapsulant 302.

In FIG. 7, the second device package 700 is formed by mounting the first device package 100 to a package substrate 702. The package substrate 702 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 702 may be an SOI substrate. Generally, an SOI substrate includes a layer of a semiconductor material such as epitaxial silicon, germanium, silicon germanium, SOI, SiGe-on-insulator (SGOI), or combinations thereof. The package substrate 702 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for package substrate 702.

The package substrate 702 may include active and passive devices (not shown). As one of ordinary skill in the art will recognize, a wide variety of devices such as transistors, capacitors, resistors, combinations of these, and the like may be used to generate the structural and functional requirements of the design for the second device package 700. The devices may be formed using any suitable methods.

The package substrate 702 may also include metallization layers and vias (not shown) and bond pads 704 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 702 is substantially free of active and passive devices.

In some embodiments, the conductive connectors 402 are reflowed to attach the first device package 100 to the bond pads 704, thereby bonding the interposer 602 to the package substrate 702. The conductive connectors 402 electrically and/or physically couple the package substrate 702, including metallization layers in the package substrate 702, to the second device package 700. In some embodiments, passive devices (e.g., surface mount devices (SMDs), not illustrated) may be attached to the second device package 700 (e.g., bonded to the bond pads 704) prior to mounting on the package substrate 702. In such embodiments, the passive devices may be bonded to a same surface of the second device package 700 as the conductive connectors 402.

In FIG. 8, a first underfill 802 is formed between the first device package 100 and the second device package 700, surrounding the conductive connectors 402. The first underfill 802 may be formed by a capillary flow process after the first device package 100 is attached, or may be formed by a suitable deposition method before the first device package 100 is attached. In embodiments in which the first underfill 802 is formed by the capillary flow process, a quantity of a first underfill material may be deposited at corners of the first device package 100. The first device package 100 and the second device package 700 are then heated in order to flow the first underfill material. The first underfill material flows between the first device package 100 and the second device package 700 by capillary action. In some embodiments, surfaces of the first device package 100 and the second device package 700 may be activated by exposing the surfaces to a plasma before the first underfill material is deposited in order to increase the wettability of the surfaces and improve the capillary action of the first underfill material. A limited quantity of the first underfill material may be deposited to form the first underfill 802 such that the first underfill 802 is formed in a defined area. For example, a limited quantity of the first underfill material may be deposited such that a topmost extent of the first underfill is disposed below a lowermost surface of the first device package 100. A distance D1 between a periphery of the first underfill 802 and a periphery of the first device package 100 may be less than about 2 mm, less than about 2.5 mm, or less than about 3 mm. As illustrated in FIG. 8, sidewalls of the first underfill 802 may be sloped or tapered. As further illustrated in FIG. 8, a lateral periphery of the first underfill 802 may extend beyond a lateral periphery of the first device package 100. In some embodiments, the sidewalls of the first underfill 802 may be curved in a cross-sectional view (not separately illustrated).

Figure 8A:
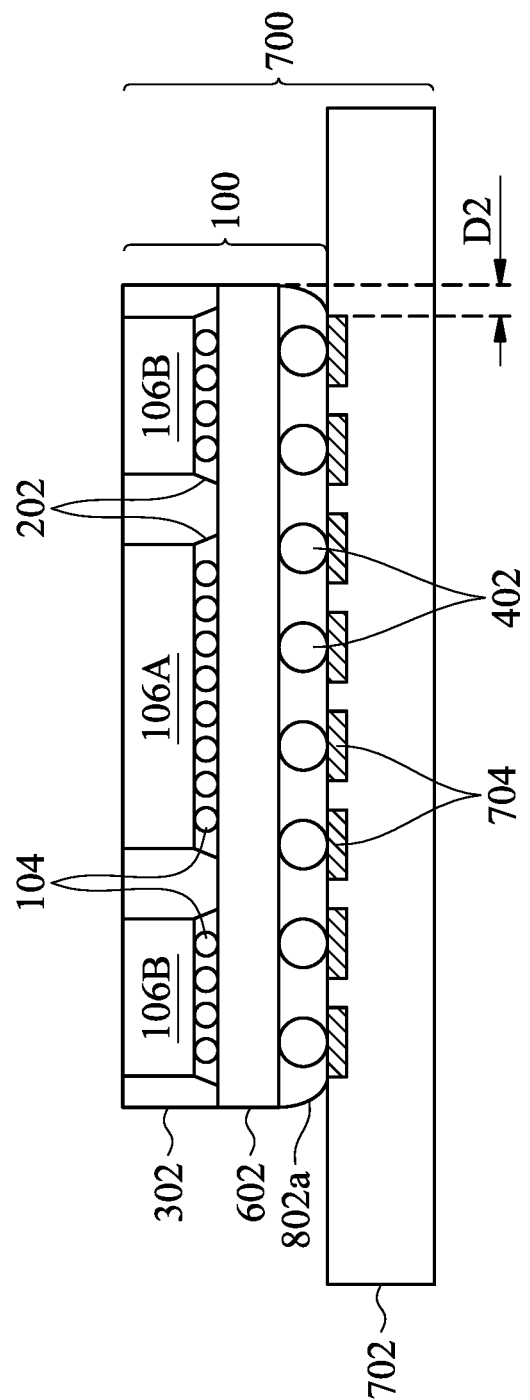

In other embodiments, as illustrated in FIG. 8A, portions of a periphery of a first underfill 802a may be disposed within the periphery of the first device package 100. For example, a distance D2 between a periphery of a lowermost surface of the first underfill 802a and the periphery of the first device package 100 may be between about 100 µm and about 200 µm, such as about 150 µm. Sidewalls of the first underfill 802a may be tapered or sloped in some embodiments. As illustrated in FIG. 8A, the sidewalls of the first underfill 802a may be curved in a cross-sectional view. In still further embodiments, the first underfill 802 may have sidewalls which are substantially perpendicular to a major surface of the package substrate 702 (not separately illustrated). The sidewalls of the first underfill 802 may be aligned with sidewalls of the first device package 100.

The first underfill 802 may be any acceptable material, such as a polymer, epoxy, molding underfill, or the like. According to at least one embodiment, the first underfill 802 may be formed of an epoxy material including a silicon filler. More specifically, the first underfill 802 may be formed of an epoxy material having a weight percentage of silicon between about 50% and about 60%, such as about 60%. The first underfill 802 may have a coefficient of thermal expansion (CTE) of between about 20 ppm/° C. and about 30 ppm/° C., such as about 22 ppm/° C.

In FIG. 9, a second underfill 902 is formed around the first underfill 802 to form the semiconductor device 900. The second underfill 902 may also be formed around at least a portion of the first device package 100. Although not separately illustrated, the second underfill 902 may be formed around at least a portion of the encapsulant 302. As illustrated in FIG. 9, the second underfill 902 may extend from the surface of the package substrate 702 to a point level with an upper surface of the interposer 602. In some embodiments, a topmost extent of the second underfill 902 may be above the upper surface of the interposer 602 or below the upper surface of the interposer 602. The second underfill 902 may be formed along edges of the interposer 602 in order to seal the edges of the interposer 602 and reduce cracking of the interposer 602. The second underfill 902 may completely surround the periphery of the first underfill 802. The topmost extent of the second underfill 902 may be above a topmost surface of the first underfill 802. The second underfill 902 may be formed by depositing a quantity of a second underfill material around the first underfill 802 and heating the first device package 100 and the second device package 700 to flow the second underfill material around the first underfill 802. A distance D3 between a periphery of the second underfill 902 and a periphery of the first device package 100 may be less than about 2 mm, less than about 2.5 mm, or less than about 3 mm. As illustrated in FIG. 9, sidewalls of the second underfill 902 may be sloped or tapered.

In some embodiments, such as the embodiment illustrated in FIG. 9A, a second underfill 902a may have sloped or tapered sidewalls, which are curved in a cross-sectional view. Although not separately illustrated, the second underfill 902a may be formed around at least a portion of the encapsulant 302. A distance D4 between a periphery of the second underfill 902a and a periphery of the first device package 100 may be between about 2 mm and about 3 mm, such as about 2.5 mm.

The second underfill 902 may be any acceptable material, such as a polymer, epoxy, molding underfill, or the like. The second underfill 902 may be formed of a different material than the first underfill 802, or the second underfill 902 may be formed of a material having the same components as the first underfill 802 in a different ratio. For example, in an embodiment in which the first underfill 802 is formed of an epoxy material including a silicon filler, the second underfill 902 may be formed of an epoxy material including a silicon filler having a higher concentration of silicon than the first underfill 802. More specifically, the second underfill 902 may be formed of an epoxy material having a weight percentage of silicon between about 70% and about 85%, such as about 80% or about 85%. In some embodiments, the silicon filler included in the epoxy material of the first underfill 802 may have a different size than the silicon filler included in the epoxy material of the second underfill 902.

The second underfill 902 may have a CTE of less than about 25 ppm/° C., less than about 20 ppm/° C. or less than about 10 ppm/° C., such as about 8 ppm/° C., about 9 ppm/° C., about 11 ppm/° C., about 22 ppm/° C., or about 24 ppm/° C. As such, the CTE of the second underfill 902 may be less than the CTE of the first underfill 802 by about 18 ppm/° C., about 17 ppm/° C., or about 11 ppm/° C. The CTE of the second underfill 902 may also be matched to the CTE of the package substrate 702. For example, the CTE of the second underfill 902 may be between the CTE of the first underfill 802 and the CTE of the package substrate 702. A ratio of the CTE of the first underfill 802 to the second underfill 902 may be between about 2 and about 4, such as about 3.7, about 2.6, or about 2. Ratios of the CTE of the first underfill 802 to the second underfill 902 both greater than and less than this range may lead to cracking in the underfill due to CTE mismatches between the first underfill 802 and the second underfill 902, or due to CTE mismatches between the second underfill 902 and the semiconductor substrate 702.

The second underfill 902 may have a modulus of elasticity of between about 8 and about 15, such as about 11.0 GPa, about 9.7 GPa, or about 11.5 GPa. The first underfill 802 may have a modulus of elasticity similar to or the same as the modulus of elasticity of the second underfill 902.

After the first underfill 802 and the second underfill 902 are formed, the first underfill 802 and the second underfill 902 are cured. The first underfill 802 and the second underfill 902 may be cured at room temperature, or by applying heat or ultra-violet (UV) light. In some embodiments, the first underfill 802 may be cured before forming the second underfill 902, or the first underfill 802 and the second underfill 902 may be cured simultaneously.

The second underfill 902 may have poor flowability in comparison with the first underfill 802. For example, the second underfill 902 may have a viscosity of between about 55 Pa·s and about 70 Pa·s, such as about 65 Pa·s, while the first underfill 802 may have a viscosity of between about 100 Pa·s and about 200 Pa·s, such as about 150 Pa·s. As such, the first underfill 802 may be flowed between the first device package 100 and the second device package 700 such that the space is completely filled and the conductive connectors 402 are surrounded.

Further, the semiconductor device 900 may experience high stress/strain at the corners of the semiconductor device 900. The second underfill 902 may have less strain energy at the corners of the semiconductor device 900 than the first underfill 802. For example, the second underfill 902 may have a corner strain energy of between about 1 μJ and about 3 μJ, such as about 2.18 μJ, or about 1.68 μJ. Corner strain energy values above these values may increase the risk of cracking in the underfill to unacceptable values. The first underfill 802 may have a corner strain energy of between about 4 μJ and about 6 μJ, such as about 5.3 μJ, or about 5.08 μJ. Thus, the corner strain energy of the second underfill 902 may be less than the corner strain energy of the first underfill 802 by between about 1 μJ and about 5 μJ, such as about 1 μJ, about 2 μJ, or about 4 μJ. Increased corner strain energy may lead to cracks occurring earlier in the underfill; therefore, including the second underfill 902 having a lower corner strain energy than the first underfill 802 reduces the corner strain energy of the semiconductor device 900 and reduces the likelihood of cracking in the underfill. Accordingly, including both the first underfill 802 and the second underfill 902 in the semiconductor device 900 may prevent bump cracking, underfill cracking, and delamination of the packaged semiconductor device 900 while still allowing an underfill to flow and substantially fill an area between the first device package 100 and the second device package 700. As a result, the overall structure of the semiconductor device 900 is more robust.

In still further embodiments, such as the embodiment illustrated in FIG. 9B, a ring 910 and/or a lid 912 may be bonded to the package substrate 702. The lid 912 may be adhered directly to the first device package 100 through a thermal interface material (TIM) 918 and the lid 912 may be adhered to the ring 910 through a first adhesive layer 916. The ring 910 may be adhered to the package substrate 702 through a second adhesive layer 914. The ring 910 may support the lid 912 and space the lid 912 apart from the package substrate 702 to house the first device package 100. In some embodiments, the ring 910 may be omitted and the ring 912 may be attached directly to the package substrate 702.

The lid 912 may be formed of a metal such as copper (Cu), nickel (Ni), nickel-coated copper, aluminum (Al), an aluminum alloy, or the like. The ring 9102 may be formed of a metal, such as copper (Cu), nickel (Ni), nickel-coated copper, aluminum (Al), an aluminum alloy, or the like. The first adhesive layer 916 and the second adhesive layer 914 may be formed of an adhesive material, such as silicone or the like. The TIM 918 may be formed of silicones which are polymers including silicon, carbon, hydrogen, oxygen, and sometimes other elements; alumina (Al2O3) or zinc oxide (ZnO2) mixed with silicone ([R2SiO]n); or the like. The lid 912, the ring 910, and the TIM 918 may be formed of materials having high thermal conductivity. As a result, the lid 912, the ring 910, and the TIM 918 may be used to dissipate heat generated in the first device package 100 to the external environment. Moreover, the lid 912 and the ring 910 may provide protection for the first device package 100.

Figure 13:
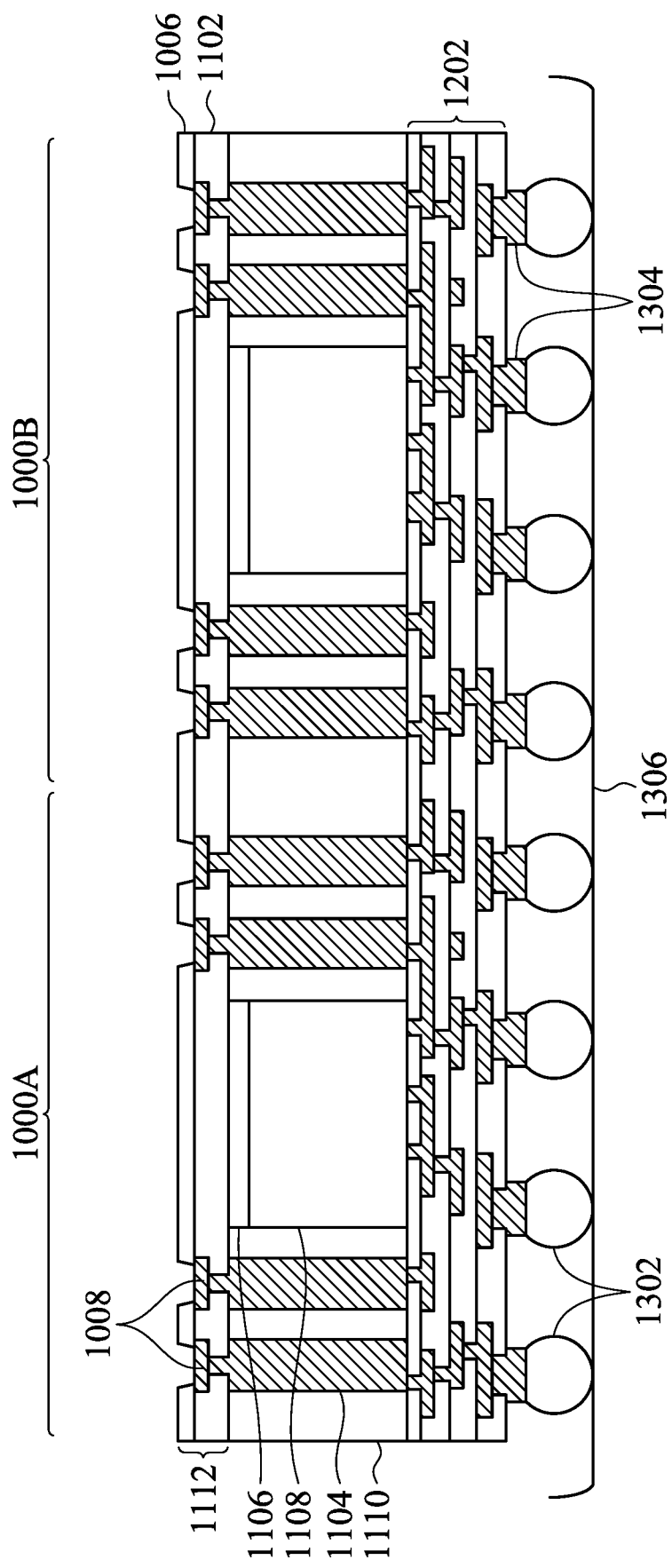
Figure 14:
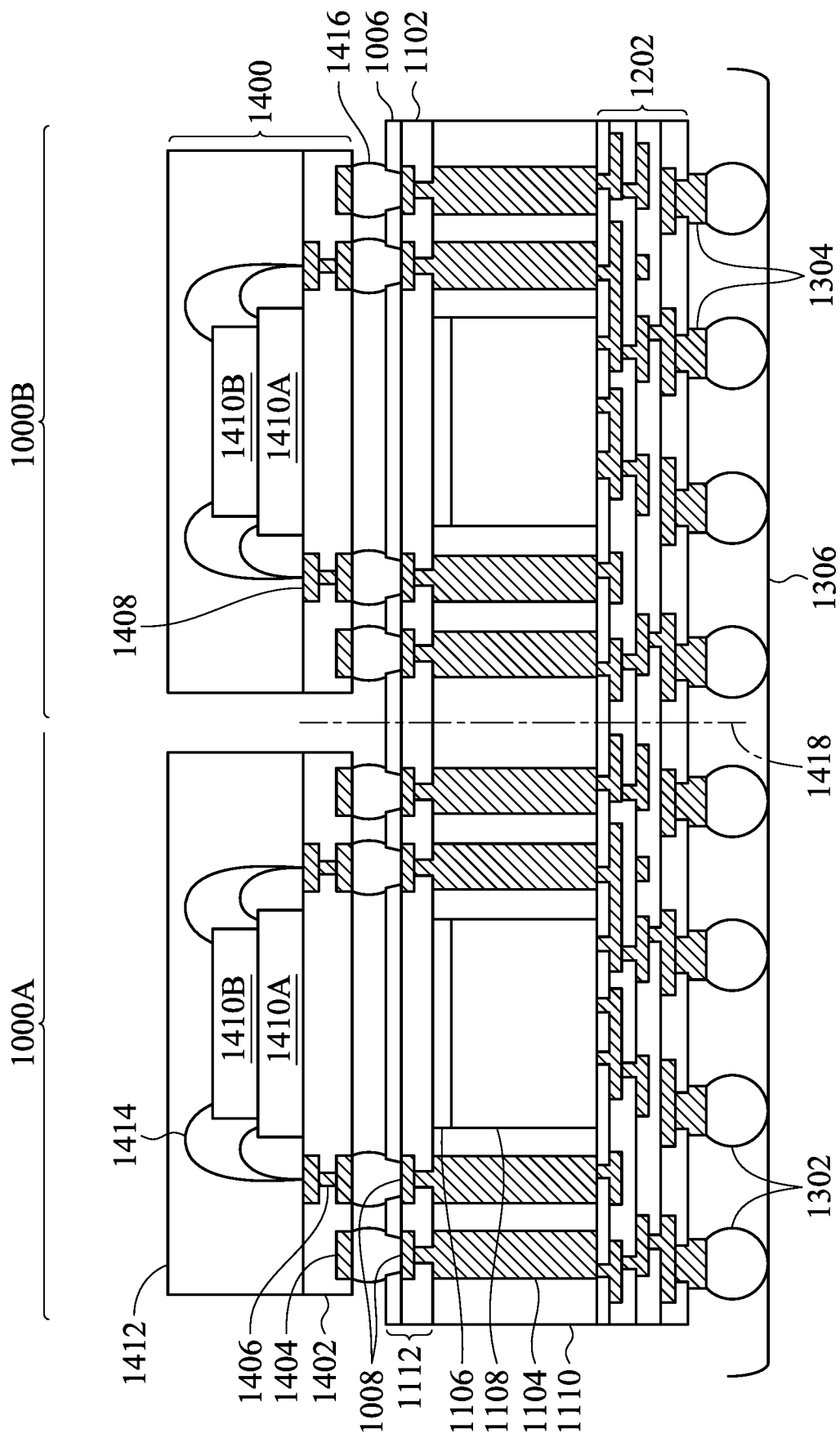
Figure 15:
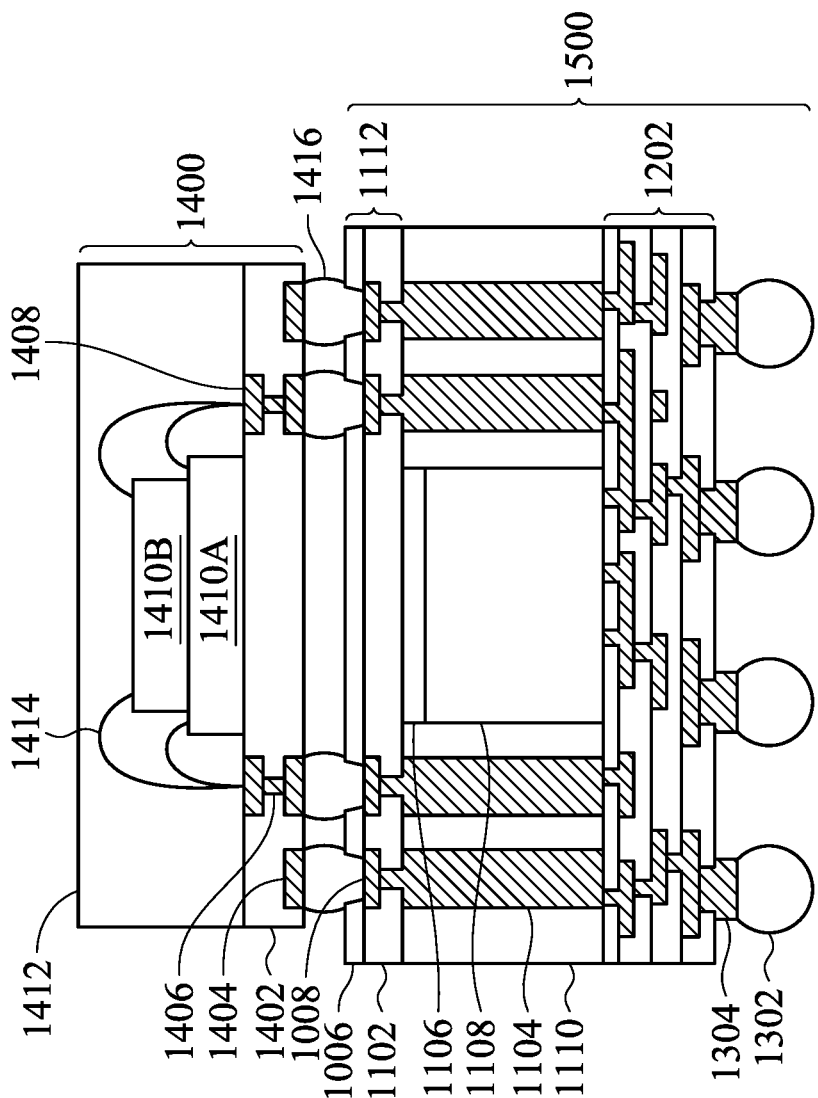
Figure 16:
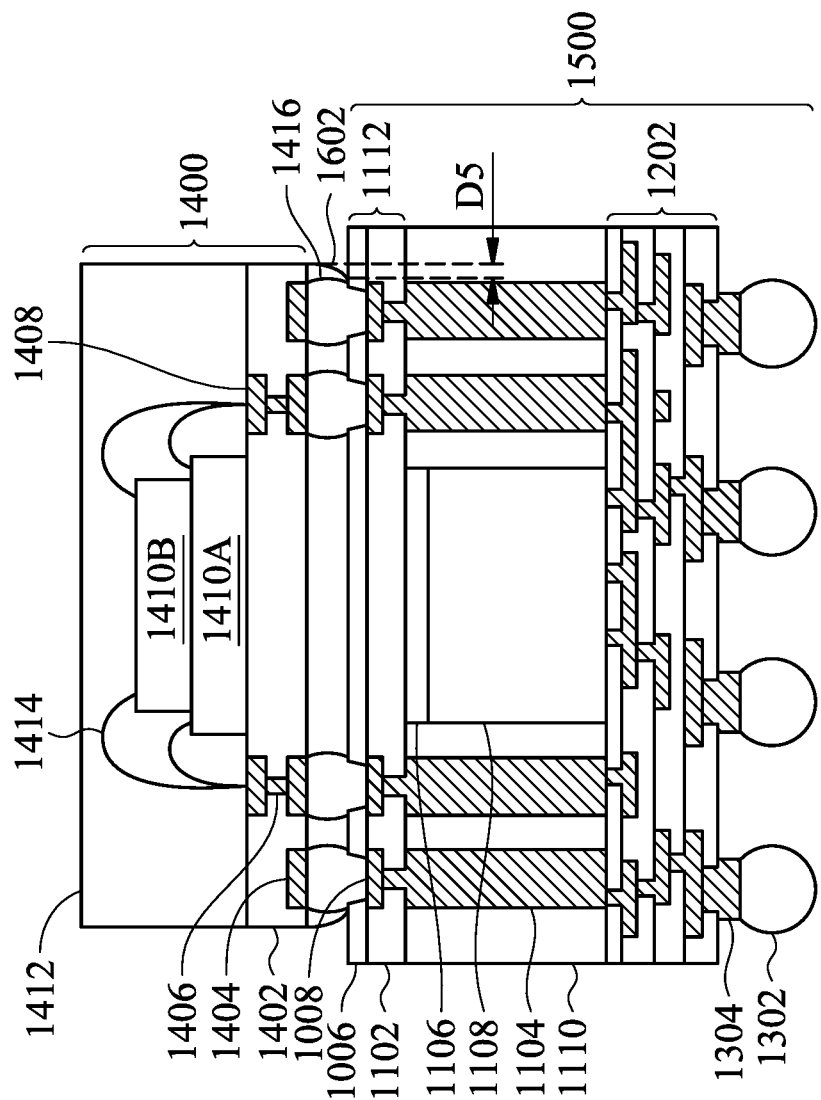
Figure 17:
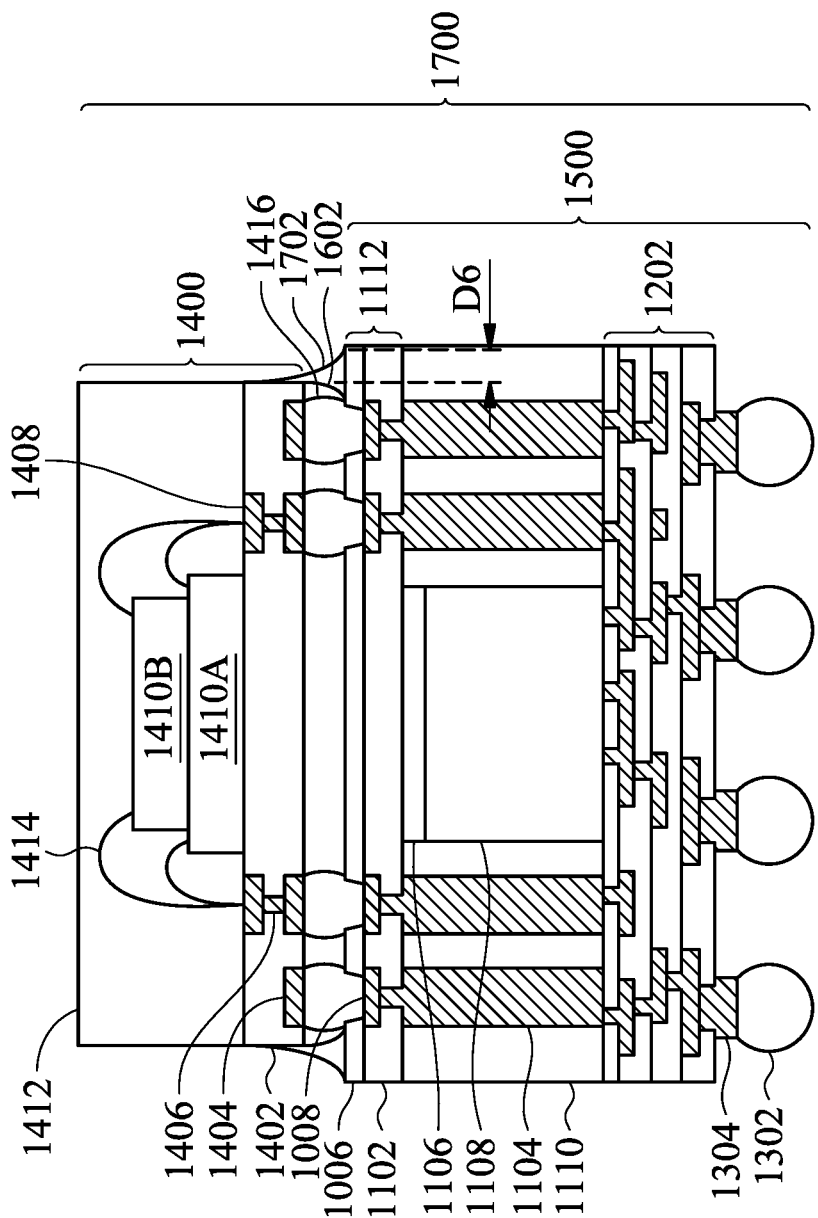

FIGS. 10 through 17 are various cross-sectional views of intermediate steps during a process for forming a semiconductor device 1700, in accordance with some embodiments. FIGS. 10 through 14 illustrate cross-sectional views of intermediate steps during a process for forming a first package 1400, in accordance with some embodiments. The first package 1400 may also be referred to as an integrated fan-out (InFO) package. In FIGS. 15 through 17, a second package 1500 is mounted to the first package 1400 and underfilled to form the semiconductor device 1700.

Figure 10:
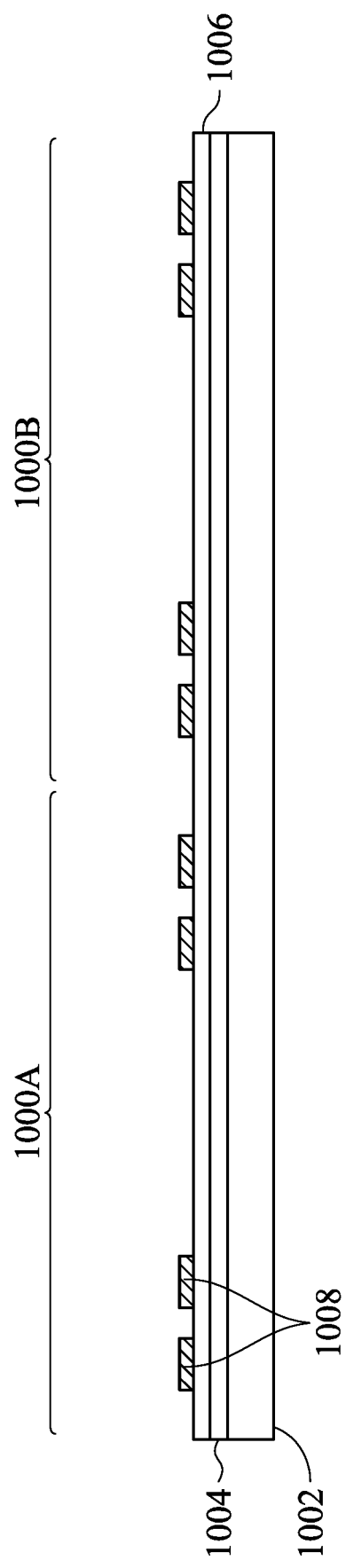
FIGS. 10 through 17 illustrate cross-sectional views of intermediary stages of manufacturing a semiconductor device package in accordance with some embodiments.

FIG. 10 illustrates a carrier substrate 1002, a release layer 1004 formed on the carrier substrate 1002, a dielectric layer 1006 formed on the release layer 1004, and a metallization pattern 1008 (sometimes referred to as a redistribution layer or a redistribution line) formed on the dielectric layer 1006. A first package region 1000A and a second package region 1000B for the formation of a first package and a second package, respectively, are illustrated.

The carrier substrate 1002 may be a glass carrier substrate, a ceramic carrier substrate, or the like. The carrier substrate 1002 may be a wafer, such that multiple packages can be formed on the carrier substrate 1002 simultaneously. The release layer 1004 may be formed of a polymer-based material, which may be removed along with the carrier substrate 1002 from the overlying structures that will be formed in subsequent steps. In some embodiments, the release layer 1004 is an epoxy-based thermal-release material, which loses its adhesive property when heated, such as a light-to-heat-conversion (LTHC) release coating. In other embodiments, the release layer 1004 may be an ultra-violet (UV) glue, which loses its adhesive property when exposed to UV lights. The release layer 1004 may be dispensed as a liquid and cured, may be a laminate film laminated onto the carrier substrate 1002, or may be the like. The top surface of the release layer 1004 may be leveled and may have a high degree of coplanarity.

In some embodiments, the dielectric layer 1006 is formed of a polymer, such as polybenzoxazole (PBO), polyimide, benzocyclobutene (BCB), or the like. In other embodiments, the dielectric layer 1006 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 1006 may be formed by any acceptable deposition process, such as spin coating, chemical vapor deposition (CVD), laminating, the like, or a combination thereof.

The metallization pattern 1008 is formed on the dielectric layer 1006. As an example to form metallization pattern 1008, a seed layer (not separately illustrated) is formed over the dielectric layer 1006. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 1008. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 1008.

Figure 11:
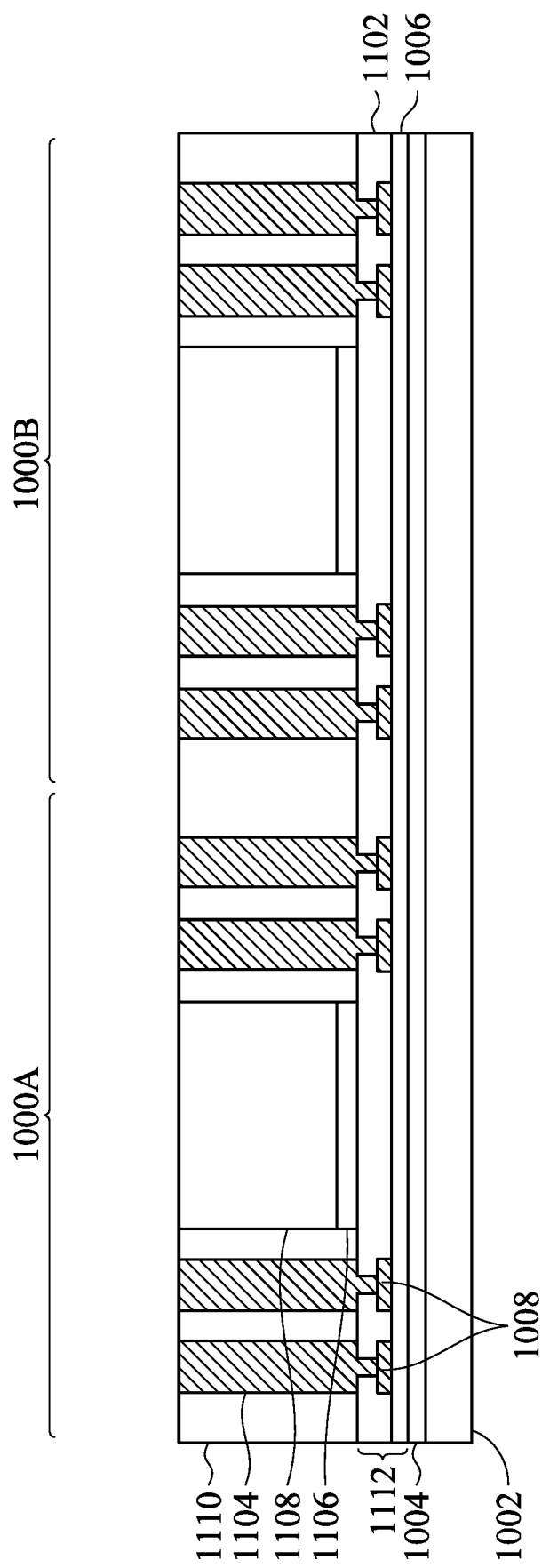

In FIG. 11, a dielectric layer 1102 is formed on the metallization pattern 1008, through vias 1104 are formed, an integrated circuit die 1108 is adhered to the dielectric layer 1102 through an adhesive 1106, and an encapsulant 1110 is formed around the various components. In some embodiments, the dielectric layer 1102 is formed of a polymer, which may be a photo-sensitive material such as PBO, polyimide, BCB, or the like, that may be patterned using a lithography mask. In other embodiments, the dielectric layer 1102 is formed of a nitride such as silicon nitride; an oxide such as silicon oxide, PSG, BSG, BPSG; or the like. The dielectric layer 1102 may be formed by spin coating, lamination, CVD, the like, or a combination thereof. The dielectric layer 1102 is then patterned to form openings to expose portions of the metallization pattern 1008. The patterning may be by an acceptable process, such as by exposing the dielectric layer 1102 to light when the dielectric layer is a photo-sensitive material or by etching using, for example, an anisotropic etch.

The dielectric layers 1006 and 1102 and the metallization pattern 1008 may be referred to as a back-side redistribution structure 1112. As illustrated, the back-side redistribution structure 1112 includes the two dielectric layers 1006 and 1102 and one metallization pattern 1008. In other embodiments, the back-side redistribution structure 1112 can include any number of dielectric layers, metallization patterns, and vias. One or more additional metallization pattern and dielectric layer may be formed in the back-side redistribution structure 1112 by repeating the processes for forming a metallization pattern 1008 and dielectric layer 1102. Vias may be formed during the formation of a metallization pattern by forming the seed layer and conductive material of the metallization pattern in the opening of the underlying dielectric layer. The vias may therefore interconnect and electrically couple the various metallization patterns.

The through vias 1104 may be formed by forming a seed layer (not separately illustrated) over the back-side redistribution structure 1112, e.g., the dielectric layer 1102 and the exposed portions of the metallization pattern 1008 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to through vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form through vias 1104.

Integrated circuit dies 1108 may then be adhered to the dielectric layer 1102 by an adhesive 1106. As illustrated in FIG. 11, one integrated circuit die 1108 is adhered in each of the first package region 1000A and the second package region 1000B; however, in other embodiments, more or less integrated circuit dies 1108 may be adhered in each region. For example, in an embodiment, two or more integrated circuit dies 1108 may be adhered in each region. The integrated circuit dies 1108 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 1108 may be different sizes (e.g., different heights and/or surface areas), and in other embodiments, the integrated circuit dies 1108 may be the same size (e.g., same heights and/or surface areas).

The adhesive 1106 is on back-sides of the integrated circuit dies 1108 and adheres the integrated circuit dies 1108 to the back-side redistribution structure 1112, such as the dielectric layer 1102 in the illustration. The adhesive 1106 may be any suitable adhesive, epoxy, die attach film (DAF), or the like. The adhesive 1106 may be applied to a back-side of the integrated circuit dies 1108, such as to a back-side of a respective semiconductor wafer or may be applied over the surface of a carrier substrate of the integrated circuit dies 1108. The integrated circuit dies 1108 may be adhered to the dielectric layer 1102 by the adhesive 1106 using, for example, a pick-and-place tool.

The encapsulant 1110 may then be formed on the various components. The encapsulant 1110 may be a molding compound, epoxy, or the like, and may be applied by compression molding, transfer molding, or the like. After curing, the encapsulant 1110 can undergo a grinding process to expose the through vias 1104 and top surfaces of the integrated circuit dies 1108. Following the grinding process, top surfaces of the through vias 1104, the integrated circuit dies 1108, and the encapsulant 1110 may be co-planar. In some embodiments, the grinding may be omitted, for example, if through vias 1104 and top surfaces of the integrated circuit dies 1108 are already exposed.

Figure 12:
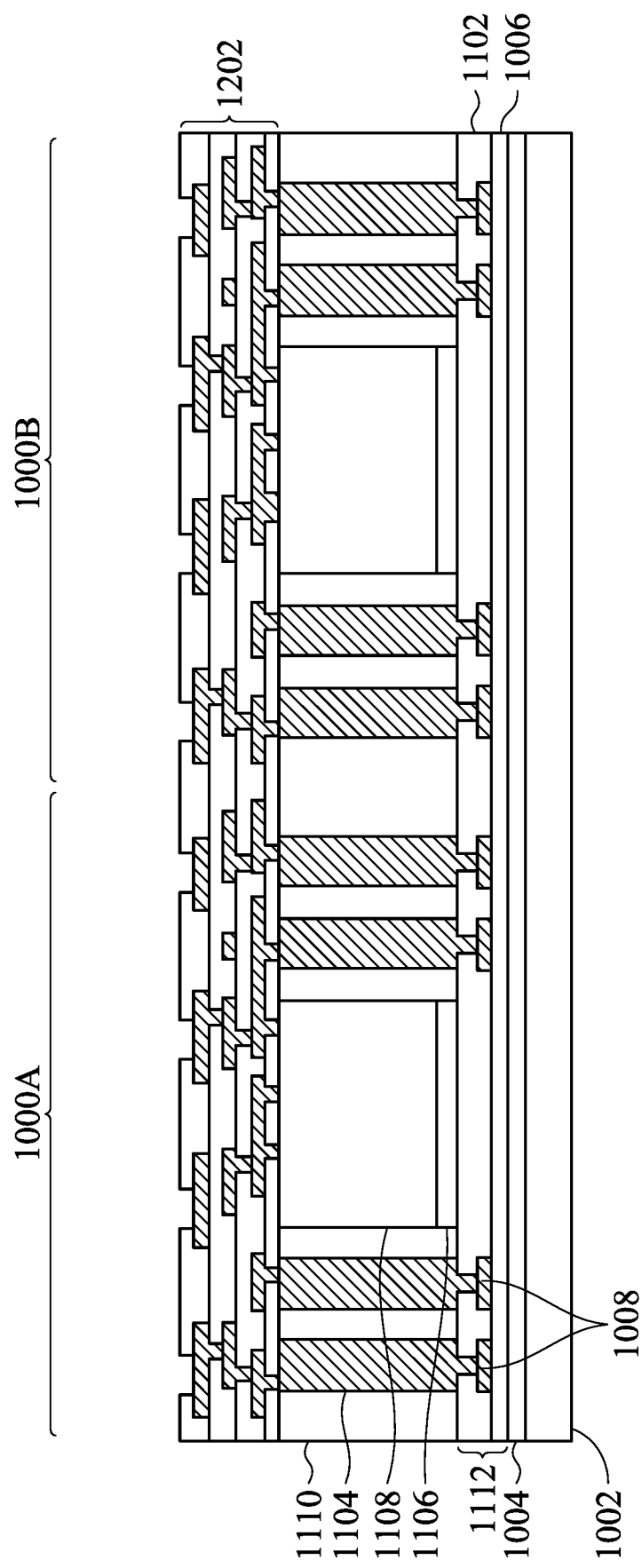

In FIG. 12, a front-side redistribution structure 1202 is formed. The front-side redistribution structure 1202 includes various dielectric layers and metallization patterns (not separately labeled), sometimes referred to as redistribution layers or redistribution lines. The dielectric layers may be formed of a polymer, which may be a photo-sensitive material such as PBO, polyimide, BCB, or the like, that may be patterned using a lithography mask. In other embodiments, the dielectric layers are formed of a nitride such as silicon nitride; an oxide such as silicon oxide, PSG, BSG, BPSG; or the like. The dielectric layers may each be formed by spin coating, lamination, CVD, the like, or a combination thereof. The dielectric layers are then patterned. The patterning forms openings in each of the dielectric layers to expose portions of the through vias 1104 and top surfaces of the integrated circuit dies 1108 or underlying metallization patterns. The patterning may be by an acceptable process, such as by exposing the respective dielectric layer to light when the dielectric layer is a photo-sensitive material or by etching using, for example, an anisotropic etch. If the dielectric layer is a photo-sensitive material, the dielectric layer can be developed after the exposure.

After each of the dielectric layers is formed, a metallization pattern may be formed on the respective dielectric layer. As an example to form one of the metallization patterns, a seed layer (not separately illustrated) is formed over the dielectric layer and in openings through the dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern and vias. The vias are formed in openings through the dielectric layer to, e.g., the through vias 1104, top surfaces of the integrated circuit dies 1108, and/or the underlying metallization patterns.

The front-side redistribution structure 1202 is shown as an example. More or fewer dielectric layers and metallization patterns may be formed in the front-side redistribution structure 1202. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

In FIG. 13, pads 1304 are formed on an exterior side of the front-side redistribution structure 1202, conductive connectors 1302 are formed on the pads 1304, the carrier substrate 1002 is de-bonded, and the structure is then flipped over and placed on a tape 1306.

The pads 1304 are used to couple to conductive connectors 1302 and may be referred to as under bump metallurgies (UBMs) 1304. In the illustrated embodiment, the pads 1304 are formed through openings through the topmost dielectric layer of FIG. 12 to the topmost metallization pattern of FIG. 12. As an example to form the pads 1304, a seed layer (not separately illustrated) is formed over the topmost dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned over the seed layer. The photoresist may be formed by spin coating or the like and may be exposed to light for patterning. The pattern of the photoresist corresponds to the pads 1304. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the pads 1304. In the embodiment, where the pads 1304 are formed differently, more photoresist and patterning steps may be utilized.

The conductive connectors 1302 are formed on the UBMs 1304. The conductive connectors 1302 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 1302 may include a conductive material such as solder, copper, aluminum, gold, nickel, silver, palladium, tin, the like, or a combination thereof. In some embodiments, the conductive connectors 1302 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 1302 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the conductive connectors 1302. The metal cap layer may include nickel, tin, tin-lead, gold, silver, palladium, indium, nickel-palladium-gold, nickel-gold, the like, or a combination thereof and may be formed by a plating process.

A carrier substrate de-bonding is then performed to detach (de-bond) the carrier substrate 1002 from the back-side redistribution structure 1112, e.g., dielectric layer 1006. In accordance with some embodiments, the de-bonding includes projecting a light such as a laser light or an UV light on the release layer 1004 so that the release layer 1004 decomposes under the heat of the light and the carrier substrate 1002 can be removed. The structure is then flipped over and placed on the tape 1306.

As further illustrated in FIG. 13, openings are formed through the dielectric layer 1006 to expose portions of the metallization pattern 1008. The openings may be formed, for example, using laser drilling, etching, or the like.

In FIG. 14, second packages 1400 are attached to the metallization pattern 1008 in the first package region 1000A and the second package region 1000B. The second packages 1400 each include a substrate 1402 and one or more stacked dies 1410 (1410A and 1410B) coupled to the substrate 1402. Although a singular stack of dies 1410 (1410A and 1410B) is illustrated, in other embodiments, a plurality of stacked dies 1410 (each having one or more stacked dies) may be disposed side by side coupled to a same surface of the substrate 1402. The substrate 1402 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 1402 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 1402 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 1402.

The substrate 1402 may include active and passive devices (not shown). As one of ordinary skill in the art will recognize, a wide variety of devices such as transistors, capacitors, resistors, combinations of these, and the like may be used to generate the structural and functional requirements of the design for the second package 1400. The devices may be formed using any suitable methods.

The substrate 1402 may also include metallization layers (not shown) and through vias 1406. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 1402 is substantially free of active and passive devices.

The substrate 1402 may have bond pads 1408 on a first side the substrate 1402 to couple to the stacked dies 1410, and bond pads 1404 on a second side of the substrate 1402, the second side being opposite the first side of the substrate 1402, to couple to functional connectors 1416. In some embodiments, the bond pads 1408 and 1404 are formed by forming recesses (not shown) into dielectric layers on the first and second sides of the substrate 1402. The recesses may be formed to allow the bond pads 1408 and 1404 to be embedded into the dielectric layers. In other embodiments, the recesses are omitted as the bond pads 1408 and 1404 may be formed on the dielectric layer. In some embodiments, the bond pads 1408 and 1404 include a thin seed layer (not shown) made of copper, titanium, nickel, gold, palladium, the like, or a combination thereof. The conductive material of the bond pads 1408 and 1404 may be deposited over the thin seed layer. The conductive material may be formed by an electro-chemical plating process, an electroless plating process, CVD, ALD, PVD, the like, or a combination thereof. In an embodiment, the conductive material of the bond pads 1408 and 1404 is copper, tungsten, aluminum, silver, gold, the like, or a combination thereof.

In an embodiment, the bond pads 1408 and 1404 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the bond pads 1408 and 1404. Any suitable materials or layers of material that may be used for the bond pads 1408 and 1404 are fully intended to be included within the scope of the current application. In some embodiments, the through vias 1406 extend through the substrate 1402 and couple at least one bond pad 1408 to at least one bond pad 1404

In the illustrated embodiment, the stacked dies 1410 are coupled to the substrate 1402 by wire bonds 1414, although other connections may be used, such as conductive bumps. In an embodiment, the stacked dies 1410 are stacked memory dies. For example, the stacked dies 1410 may be memory dies such as low-power (LP) double data rate (DDR) memory modules, such as LPDDR1, LPDDR2, LPDDR3, LPDDR4, or the like memory modules.

The stacked dies 1410 and the wire bonds 1414 may be encapsulated by a molding material 1412. The molding material 1412 may be molded on the stacked dies 1410 and the wire bonds 1414, for example, using compression molding. In some embodiments, the molding material 1412 is a molding compound, a polymer, an epoxy, silicon oxide filler material, the like, or a combination thereof. A curing step may be performed to cure the molding material 1412, wherein the curing may be a thermal curing, a UV curing, the like, or a combination thereof.

In some embodiments, the stacked dies 1410 and the wire bonds 1414 are buried in the molding material 1412, and after the curing of the molding material 1412, a planarization step, such as a grinding, is performed to remove excess portions of the molding material 1412 and provide a substantially planar surface for the second package 1400.

After the second packages 1400 are formed, the second packages 1400 are mechanically and electrically bonded to the metallization pattern 1008 in the first package region 1000A and the second package region 1000B by way of functional connectors 1416, the bond pads 1404. In some embodiments, the stacked dies 1410 may be coupled to the integrated circuit die 1108 through the wire bonds 1414, the bond pads 1408 and 1404, through vias 1406, the functional connectors 1416, and the through vias 1104.

The functional connectors 1416 may be similar to the conductive connectors 1302 described above and the description is not repeated herein, although the functional connectors 1416 and the conductive connectors 1302 need not be the same. The functional connectors 1416 may be disposed on an opposing side of the substrate 1402 as the stacked dies 1410.

In FIG. 15, a singulation process is performed by sawing along scribe line regions 1418 (illustrated in FIG. 14) e.g., between adjacent regions 1000A and 1000B. The sawing singulates the first package region 1000A from the second package region 1000B. FIG. 15 illustrates a resulting, singulated first package 1500, which may be from one of the first package region 1000A or the second package region 1000B. The first package 1500 may also be referred to as an integrated fan-out (InFO) package 1500.

In FIG. 16, a first underfill 1602 is formed between the first package 1500 and the second package 1400, surrounding the functional connectors 1416. The first underfill 1602 may be formed by a capillary flow process after the second package 1400 is attached to the first package 1500, or may be formed by a suitable deposition method before the second package 1400 is attached to the first package 1500. In embodiments in which the first underfill 1602 is formed by the capillary flow process, a quantity of a first underfill material may be deposited at corners of the second package 1400. The first package 1500 and the second package 1400 are then heated in order to flow the first underfill material. The first underfill material flows between the first package 1500 and the second package 1400 by capillary action. In some embodiments, surfaces of the second package 1400 and the first package 1500 may be activated by exposing the surfaces to a plasma before the first underfill material is deposited in order to increase the wettability of the surfaces and improve the capillary action of the first underfill material.

A limited quantity of a first underfill material may be deposited to form the first underfill 1602 such that the first underfill 1602 is formed in a defined area. Portions of a periphery of a first underfill 1602 may be disposed within the periphery of the second package 1400. For example, a distance D5 between a periphery of a lowermost surface of the first underfill 1602 and the periphery of the second package 1400 may be between about 100 μm and about 200 μm, such as about 150 μm. Sidewalls of the first underfill 1602 may be tapered or sloped in some embodiments. As illustrated in FIG. 16, the sidewalls of the first underfill 1602 may be curved in a cross-sectional view. In still further embodiments, the first underfill 1602 may have sidewalls which are substantially perpendicular to a major surface of the first package 1500 (not separately illustrated), or the first underfill 1602 may have sidewalls which are tapered or sloped and extend past a periphery of the second package 1400.

The first underfill 1602 may be any acceptable material, such as a polymer, epoxy, molding underfill, or the like. According to at least one embodiment, the first underfill 1602 may be formed of an epoxy material including a silicon filler. More specifically, the first underfill 1602 may be formed of an epoxy material having a weight percentage of silicon between about 60% and about 70%, such as about 75%. The first underfill 1602 may have a CTE of between about 20 ppm/° C. and about 30 ppm/° C., such as about 20 ppm/° C.

In FIG. 17, a second underfill 1702 is formed around the first underfill 1602 to form the semiconductor device 1700. The second underfill 1702 may also be formed around at least a portion of the second package 1400, such as around the substrate 1402 and/or the molding material 1412. As illustrated in FIG. 17, the second underfill 1702 may extend from the surface of the dielectric layer 1006 to a point level with an upper surface of the substrate 1402. In some embodiments, a topmost extent of the second underfill 1702 may be above the upper surface of the substrate 1402 or below the upper surface of the substrate 1402. The second underfill 1702 may be formed along edges of the substrate 1402 in order to seal the edges of the substrate 1402 and reduce cracking of the substrate 1402. The second underfill 1702 may completely surround the periphery of the first underfill 1602. The topmost extent of the second underfill 1702 may extend above a topmost surface of the first underfill 1602. The second underfill 1702 may be formed by depositing a quantity of a second underfill material around the first underfill 1602 and reflowing the second underfill material. A distance D6 between a periphery of the second underfill 1702 and a periphery of the second package 1400 may be less than about 2 mm, less than about 2.5 mm, or less than about 3 mm. As illustrated in FIG. 17, sidewalls of the second underfill 1702 may be sloped or tapered and may be curved in a cross-sectional view.

The second underfill 1702 may be any acceptable material, such as a polymer, epoxy, molding underfill, or the like. The second underfill 1702 may be formed of a different material than the first underfill 1602, or the second underfill 1702 may be formed of a material having the same components as the first underfill 1602 in a different ratio. For example, in an embodiment in which the first underfill 1602 is formed of an epoxy material including a silicon filler, the second underfill 1702 may be formed of an epoxy material including a silicon filler having a higher concentration of silicon than the first underfill 1602. More specifically, the second underfill 1702 may be formed of an epoxy material having a weight percentage of silicon between about 70% and about 85%, such as about 75% or about 85%. In some embodiments, the silicon filler included in the epoxy material of the first underfill 1602 may have a different size than the silicon filler included in the epoxy material of the second underfill 1702.

The second underfill 1702 may have a CTE of less than about 25 ppm/° C., less than about 20 ppm/° C. or less than about 10 ppm/° C., such as about 8 ppm/° C., about 9 ppm/° C., about 11 ppm/° C., about 22 ppm/° C., or about 24 ppm/° C. As such, the CTE of the second underfill 1702 may be less than the CTE of the first underfill 1602 by about 18 ppm/° C., about 17 ppm/° C., or about 11 ppm/° C. The CTE of the second underfill 1702 may also be matched to the CTE of the first package 1500. For example, the CTE of the second underfill 1702 may be between the CTE of the first underfill 1602 and the CTE of the first package 1500. A ratio of the CTE of the first underfill 1602 to the second underfill 1702 may be between about 2 and about 4, such as about 3.7, about 2.6, or about 2. Ratios of the CTE of the first underfill 1602 to the second underfill 1702 both greater than and less than this range may lead to cracking in the underfill due to CTE mismatches between the first underfill 1602 and the second underfill 1702, or due to CTE mismatches between the second underfill 1702 and the first package 1500.

After the first underfill 1602 and the second underfill 1702 are formed, the first underfill 1602 and the second underfill 1702 are cured. The first underfill 1602 and the second underfill 1702 may be cured at room temperature, or by applying heat or ultra-violet (UV) light. In some embodiments, the first underfill 1602 may be cured before forming the second underfill 1702, or the first underfill 1602 and the second underfill 1702 may be cured simultaneously.

The second underfill 1702 may have poor flowability in comparison with the first underfill 1602. For example, the second underfill 1702 may have a viscosity of between about 55 Pa·s and about 70 Pa·s, such as about 65 Pa·s, while the first underfill 1602 may have a viscosity of between about 100 Pa·s and about 200 Pa·s, such as about 150 Pa·s. As such, the first underfill 1602 may be flowed between the first package 1500 and the second package 1400 that the space is completely filled and the functional connectors 1416 are surrounded.

Further, the semiconductor device 1700 may experience high stress/strain at the corners of the semiconductor device 1700. The second underfill 1702 may have less strain energy at the corners of the semiconductor device 1700 than the first underfill 1602. For example, the second underfill 1702 may have a corner strain energy of between about 1 µJ and about 3 µJ, such as about 2.18 µJ, or about 1.68 µJ. Corner strain energy values above these values may increase the risk of cracking in the underfill to unacceptable values. The first underfill 1602 may have a corner strain energy of between about 4 µJ and about 6 µJ, such as about 5.08 µJ, or about 5.3 µJ. Thus, the corner strain energy of the second underfill 1702 may be less than the corner strain energy of the first underfill 1602 by between about 1 µJ and about 5 µJ, such as about 1 µJ, about 2 µJ, or about 4 µJ. Increased corner strain energy may lead to cracks occurring earlier in the underfill; therefore, including the second underfill 1702 having a lower corner strain energy than the first underfill 1602 reduces the corner strain energy of the semiconductor device 1700 and reduces the likelihood of cracking in the underfill. Accordingly, including both the first underfill 1602 and the second underfill 1702 in the semiconductor device 1700 may prevent bump cracking, underfill cracking, and delamination of the packaged semiconductor device 1700 while still allowing an underfill to flow and substantially fill an area between the first package 1500 and the second package 1400. As a result, the overall structure of the semiconductor device 1700 is more robust.

Although not separately illustrated, according to some embodiments, the semiconductor device 1700 may include on or more lids and rings similar to the ring 912 and the lid 914 discussed above in reference to the embodiment illustrated in FIG. 9B. More specifically, a first lid and a first ring may be provided to dissipate heat generated in the first package 1500 and to protect the first package 1500 and a second lid and a second lid may be provided to dissipate heat generated in the second package 1400 and to protect the second package 1400. In some embodiments, a single ring and a single lid may be provided to dissipate heat generated in both the first package 1500 and the second package 1400 and to protect both the first package 1500 and the second package 1400. As such, heat may be dissipated from the first package 1500 and the second package 1400 to the external environment and the first package 1500 and the second package 1400 may be protected.

According to an embodiment, a device includes a package including an integrated circuit die, an interposer bonded to the integrated circuit die by a plurality of die connectors, and an encapsulant surrounding the integrated circuit die; a package substrate bonded to the interposer by a plurality of conductive connectors; a first underfill between the package and the package substrate, the first underfill having a first coefficient of thermal expansion (CTE); and a second underfill surrounding the first underfill, the second underfill having a second CTE less than the first CTE. In an embodiment, the first underfill tapers from the package toward the package substrate. In an embodiment, the second underfill tapers from the package substrate toward the package. In an embodiment, the first underfill and the second underfill taper from the package substrate toward the package. In an embodiment, the first underfill is in contact with the interposer and spaced apart from the encapsulant. In an embodiment, the second underfill is in contact with the package and spaced apart from the conductive connectors. In an embodiment, the first underfill has a greater flowability than the second underfill.

In accordance with another embodiment, a method includes attaching a die to a first surface of an interposer; encapsulating the die with an encapsulant; forming a plurality of conductive connectors on a second surface of the interposer, the second surface being opposite the first surface; bonding the interposer to a package substrate through the conductive connectors; depositing a first underfill between the interposer and the package substrate and around the conductive connectors; and depositing a second underfill surrounding the first underfill, the second underfill having a lower coefficient of thermal expansion (CTE) than the first underfill. In an embodiment, forming the first underfill includes flowing a first underfill material between the interposer and the package substrate. In an embodiment, the first underfill is cured before forming the second underfill. In an embodiment, the first underfill and the second underfill are cured simultaneously. In an embodiment, the method further includes exposing surfaces of the interposer and the package substrate to a plasma before forming the first underfill. In an embodiment, the second underfill has a higher concentration of silicon by weight than the first underfill. In an embodiment, the second underfill has a CTE lower than a CTE of the first underfill.

In accordance with yet another embodiment, a device includes a first package including a first integrated circuit die, an encapsulant around the first integrated circuit die, and a redistribution layer over the encapsulant and the first integrated circuit die; a plurality of functional connectors; a second package bonded to the first package by the plurality of functional connectors, the functional connectors and the redistribution layer electrically connecting a second integrated circuit die of the second package to the first integrated circuit die; a first underfill between the first package and the second package, the first underfill surrounding the plurality of functional connectors; a second underfill surrounding the first underfill, the second underfill having a different material composition than the first underfill, a topmost extent of the second underfill being disposed above a topmost surface of the first underfill. In an embodiment, the second underfill has a lower coefficient of thermal expansion (CTE) than the first underfill. In an embodiment, the second underfill extends below the second package directly between the first underfill and the redistribution layer. In an embodiment, the second underfill is in contact with a first side surface of the second package and a second side surface of the second package opposite the first side surface of the second package. In an embodiment, a lateral periphery of the first underfill extends beyond a lateral periphery of the first package. In an embodiment, the second underfill extends from a top surface of the redistribution layer to a sidewall of the second package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a substrate;
   an electronic component on the substrate;
   a ring frame on the substrate and surrounding the electronic component;
   an encapsulant encapsulating the electronic component and exposing a backside surface of the electronic component, wherein a first surface of the encapsulant opposite the substrate is level with a second surface of the electronic component opposite the substrate, and wherein a third surface of the ring frame opposite the substrate is disposed at a level different from the first surface and the second surface;
   a thermal conducting material on the backside surface of the electronic component, the thermal conducting material being surrounded by the ring frame; and
   a lid on the ring frame and in contact with the thermal conducting material, wherein a projection area of the thermal conducting material on the substrate is greater than a projection area of the electronic component on the substrate.

2. The semiconductor package of claim 1, further comprising an adhesive layer connecting the lid to the ring frame.

3. The semiconductor package of claim 1, wherein the thermal conducting material has an upper surface contacting the lid and the electronic component is within a contour of the upper surface of the thermal conducting material from a top view perspective.

4. The semiconductor package of claim 1, wherein the thermal conducting material is in contact with the encapsulant and the electronic component.

5. The semiconductor package of claim 1, wherein sidewalls of the lid are aligned with sidewalls of the ring frame.

6. The semiconductor package of claim 1, wherein the ring frame has a height in a direction perpendicular to a major surface of the substrate greater than a height of the electronic component in the direction perpendicular to the major surface of the substrate.

7. The semiconductor package of claim 1, wherein the ring frame has a height in a direction perpendicular to a major surface of the substrate greater than a height of the encapsulant in the direction perpendicular to the major surface of the substrate.

8. A device comprising:
   an integrated circuit die bonded to a substrate by a first plurality of die connectors and a second plurality of die connectors;
   an encapsulant surrounding the integrated circuit die and the first plurality of die connectors;
   a first underfill material surrounding the second plurality of die connectors;
   a second underfill material different from the first underfill material, wherein the second underfill material surrounds and contacts an outer side surface of the first underfill material and an outer side surface of the encapsulant;
   a ring over the substrate;
   a lid over the ring, the integrated circuit die, and the encapsulant; and
   a thermal interface material between the lid and each of the integrated circuit die and the encapsulant, the thermal interface material having a width in a first direction greater than a width of the integrated circuit die in the first direction.

9. The device of claim 8, further comprising an adhesive layer extending from the ring to the lid.

10. The device of claim 8, wherein the thermal interface material is in contact with the lid, the integrated circuit die, and the encapsulant.

11. The device of claim 8, wherein a height of the encapsulant in a first direction is equal to a combined height of the integrated circuit die and the plurality of die connectors in the first direction.

12. The device of claim 8, wherein a width of the lid in the first direction is equal to a width of the ring in the first direction.

13. The device of claim 8, wherein a bottom surface of the lid extends below a bottom surface of the thermal interface material.

14. The device of claim 8, wherein a bottom surface of the lid extends below a top surface of the encapsulant.

15. A device comprising:
- a first integrated circuit die and a second integrated circuit die in an encapsulant;
- a first plurality of conductive elements bonding the first integrated circuit die and the second integrated circuit die to a substrate, wherein a first surface of the first integrated circuit die opposite the substrate, a second surface of the second integrated circuit die, and a third surface of the encapsulant opposite the substrate are disposed at a first level;
- a conductive ring surrounding the encapsulant, wherein a fourth surface of the conductive ring opposite the substrate is disposed at a second level different from the first level;
- a thermal interface material extending along surfaces of the encapsulant, the first integrated circuit die, and the second integrated circuit die opposite the substrate; and
- a conductive lid on the conductive ring and the thermal interface material.

16. The device of claim 15, further comprising an adhesive layer attaching the conductive lid to the conductive ring.

17. The device of claim 16, wherein the thermal interface material is separated from the adhesive layer and the conductive ring by a gap.

18. The device of claim 15, the surfaces of the encapsulant, the first integrated circuit die, and the second integrated circuit die opposite the substrate are coplanar with one another.

19. The device of claim 15, wherein the encapsulant is in contact with sidewalls of the first integrated circuit die and sidewalls of the second integrated circuit die.

20. The device of claim 15, wherein the conductive ring has a height greater than a height of the encapsulant.

* * * * *